(12) United States Patent
Lin

(10) Patent No.: US 8,860,045 B2
(45) Date of Patent: Oct. 14, 2014

(54) LED LIGHT SHEET

(75) Inventor: Kun-Chuan Lin, Taipei (TW)

(73) Assignee: Kun Hsin Technology, Taipei (TW)

( * ) Notice: Subject to any disclaimer, the term of this patent is extended or adjusted under 35 U.S.C. 154(b) by 180 days.

(21) Appl. No.: 13/567,012

(22) Filed: Aug. 4, 2012

(65) Prior Publication Data

US 2013/0248889 A1    Sep. 26, 2013

(30) Foreign Application Priority Data

Mar. 22, 2012   (TW) .............................. 101109796 A

(51) Int. Cl.
*H01L 33/00*    (2010.01)

(52) U.S. Cl.
USPC   257/88; 257/99; 257/E33.057; 257/E33.058; 257/E33.066

(58) Field of Classification Search
CPC ....... H01L 33/48; H01L 33/486; H01L 33/62; H01L 25/0753
USPC ........ 257/88, 99, E33.057, E33.058, E33.066
See application file for complete search history.

(56) References Cited

U.S. PATENT DOCUMENTS

| | | | |
|---|---|---|---|
| 8,076,680 B2 * | 12/2011 | Lee et al. ......................... | 257/88 |
| 2009/0321778 A1 * | 12/2009 | Chen et al. ...................... | 257/99 |
| 2012/0268932 A1 * | 10/2012 | Lerman et al. ................. | 362/235 |

* cited by examiner

*Primary Examiner* — Minh-Loan Tran

(74) *Attorney, Agent, or Firm* — Pai Patent & Trademark Law Firm; Chao-Chang David Pai

(57) ABSTRACT

An embodiment of the present invention provides a light emitting device including: a transparent substrate; a wiring layer disposed on the transparent substrate; a plurality of light emitting diode chips disposed on the transparent substrate and electrically connected to the wiring layer; and an opposite substrate disposed on the transparent substrate to sandwich the light emitting diode chips and the wiring layer, wherein no wiring layer is disposed on a surface of the opposite substrate facing the light emitting diode chips.

17 Claims, 5 Drawing Sheets

LED LIGHT SHEET

CROSS REFERENCE TO RELATED APPLICATIONS

This Application claims priority of Taiwan Patent Application No. 101109796, filed on Mar. 22, 2012, the entirety of which is incorporated by reference herein.

BACKGROUND OF THE INVENTION

1. Field of the Invention

The present invention relates to a light emitting device, and in particular relates to a light emitting device with a light emitting diode.

2. Description of the Related Art

Light emitting diodes have many advantages including small sizes, low driving voltages, quick response speeds, shock resistance, long life times, low power consumption, and low heat generation. Thus, the light emitting diodes can fulfil the increasing demand for compact devices in our daily life. With progress of the manufacturing methods of the light emitting diodes, the light emitting diodes have become a very popular and important electro-optic device in modern life.

In view of the advantages of the light emitting diodes, the replacement of traditional daily illuminating devices (such as fluorescent lamps or halogen lamps) by the light emitting diodes has become an important trend.

BRIEF SUMMARY OF THE INVENTION

An embodiment of the present invention provides a light emitting device, which includes: a transparent substrate; a wiring layer disposed on the transparent substrate; a plurality of light emitting diode chips disposed on the transparent substrate and electrically connected to the wiring layer; and an opposite substrate disposed on the transparent substrate to sandwich the light emitting diode chips and the wiring layer, wherein no wiring layer is disposed on a surface of the opposite substrate facing the light emitting diode chips.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

In the present invention, a plurality of unpackaged light emitting diode chips are sandwiched between a transparent substrate and an opposite substrate to form a sandwich-type light emitting device, wherein the light emitted by the light emitting diode chips can pass through the transparent substrate for illumination or advertising purposes.

Figure 1:
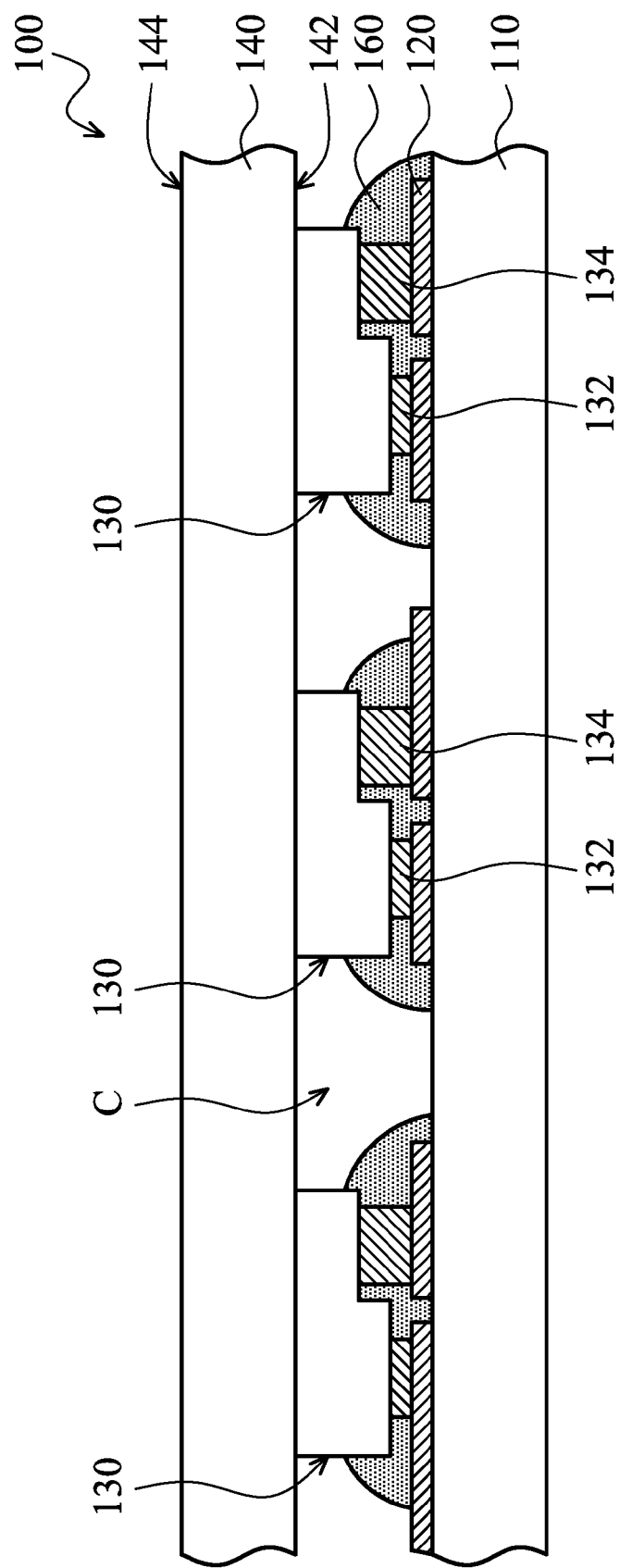
FIG. 1 is a cross-sectional view of a light emitting device in accordance with an embodiment of the present invention.

FIG. 1 is a cross-sectional view of a light emitting device in accordance with an embodiment of the present invention. Referring to FIG. 1, the light emitting device 100 of the present embodiment includes a transparent substrate 110, a wiring layer 120, a plurality of light emitting diode chips 130, and an opposite substrate 140. The transparent substrate 110 includes, for example, glass, plastic or polymer, wherein the polymer is, for example, polymethyl methacrylate (PMMA), silicone, or epoxy resin.

The wiring layer 120 and the light emitting diode chips 130 are disposed on the transparent substrate 110, wherein the light emitting diode chips 130 are electrically connected to the wiring layer 120. The wiring layer 120 includes, for example, metal or transparent conductive materials, such as indium tin oxide (ITO) or indium zinc oxide (IZO).

The opposite substrate 140 is disposed on the transparent substrate 110, and the light emitting diode chips 130 and the wiring layer 120 are sandwiched between the transparent substrate 110 and the opposite substrate 140. The opposite substrate 140 may be a transparent substrate, a translucent substrate, or an opaque substrate. The transparent substrate 110 and the opposite substrate 140 may be flexible boards or rigid boards. The material of the transparent substrate 110 may be the same with or different from the material of the opposite substrate 140.

It should be noted that the light emitting device 100 of the present embodiment uses the unpackaged light emitting diode chips 130 (with a thickness about 100 μm) as a light source. In comparison with conventional light emitting diode package structures (with a thickness larger than 1 mm), the unpackaged light emitting diode chips 130 are featured by a lower cost and smaller thickness, which may significantly reduce the manufacturing cost of the light emitting device 100, and the light emitting diode chips 130 with a smaller thickness are suitable to be sandwiched between the transparent substrate 110 and the opposite substrate 140. The light emitting device 100 (or its opposite substrate 140) may be attached onto other objects (such as ceilings or walls) for illumination or advertising purposes.

Furthermore, the light emitting diode chip 130 has a very small size, and the main portion of the light emitting diode chip 130 is transparent (wherein the semiconductor layer is transparent, and the electrodes are opaque). The wires of the wiring layer 120 are very fine and may be formed by transparent conductive materials. Thus, when using a transparent substrate as the opposite substrate 140, the light emitting device 100 may substantially be regarded as a transparent board (or a transparent film), which can serve as a window, a decorative wall, or can be attached onto windows or decorative walls. In this case, the light emitted from the light emitting diode chips 130 may be observed from two opposite sides of the light emitting device 100.

The opposite substrate 140 has a first surface 142 facing the light emitting diode chips 130 and a second surface 144 opposite to the first surface 142, and there is no wiring layer disposed on the first surface 142. That is to say, in a chamber C sandwiched between the transparent substrate 110 and the opposite substrate 140, the wiring layer 120 is only formed on the transparent substrate 110 but not formed on the opposite substrate 140. In one embodiment, there is no wiring layer disposed on the entire opposite substrate 140. That is to say, no wiring layer is disposed on the first surface 142 or the second surface 144 of the opposite substrate 140, such that there is no need to precisely align the two substrates in the manufacturing process, which benefits mass production.

In the present embodiment, the light emitting diode chips 130 are plane light emitting diode chips. Each of the light emitting diode chips 130 has a first electrode 132 and a second electrode 134, and each of the light emitting diode chips 130 is flip-chip bonded to the wiring layer 120, such that the first electrode 132 and the second electrode 134 are electrically connected to the wiring layer 120.

Specifically, if the wiring layer 120, the first electrode 132, and the second electrode 134 are made of metal, the first electrode 132 and the second electrode 134 may both be eutectic bonded to the wiring layer 120.

Figure 2:
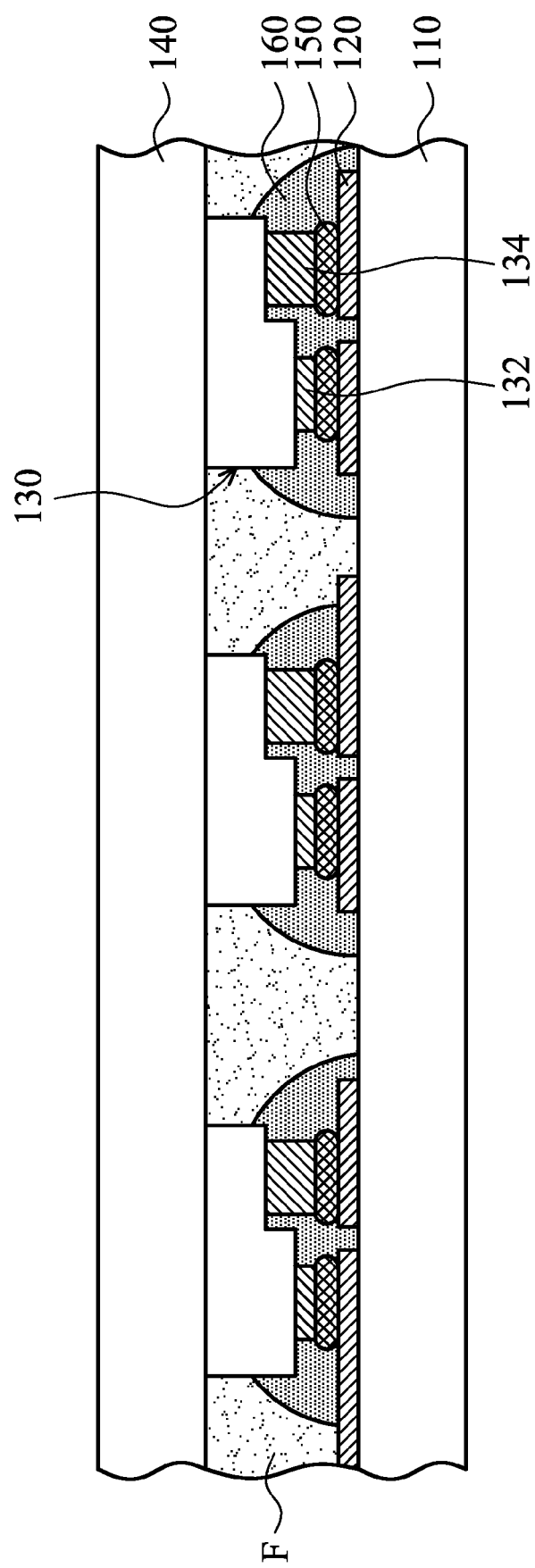
FIG. 2 is a cross-sectional view of a light emitting device in accordance with another embodiment of the present invention.

FIG. 2 is a cross-sectional view of a light emitting device in accordance with another embodiment of the present invention. Referring to FIG. 2, in another embodiment, if the wiring layer 120 includes transparent conductive materials (such as ITO or IZO), a conductive layer 150 may be formed between the electrodes (i.e. the first electrode 132 and the second electrode 134) and the wiring layer 120 so as to electrically connect the electrodes to the wiring layer 120. The conductive layer 150 includes, for example, silver paste or other suitable conductive materials.

Referring to FIGS. 1 and 2, an adhesive layer 160 may be optionally formed between the light emitting diode chips 130 and the transparent substrate 110 to affix the light emitting diode chips 130 on the transparent substrate 110. The adhesive layer 160 includes, for example, transparent insulating paste (e.g. silicone or epoxy resin). In one embodiment, the transparent insulating paste may be mixed with a fluorescent powder (not shown), such that the light emitting device 100 can emit light with a specific color.

The chamber C may be optionally under vacuum (as shown in FIG. 1) or filled with a filler material F (as shown in FIG. 2), wherein the filler material F includes nitrogen, inert gases, transparent gel, or other materials which are suitable to be filled in the chamber C without affecting operation of the wiring layer 120 and the light emitting diode chips 130. The transparent gel may be optionally mixed with a fluorescent powder.

Figure 3:
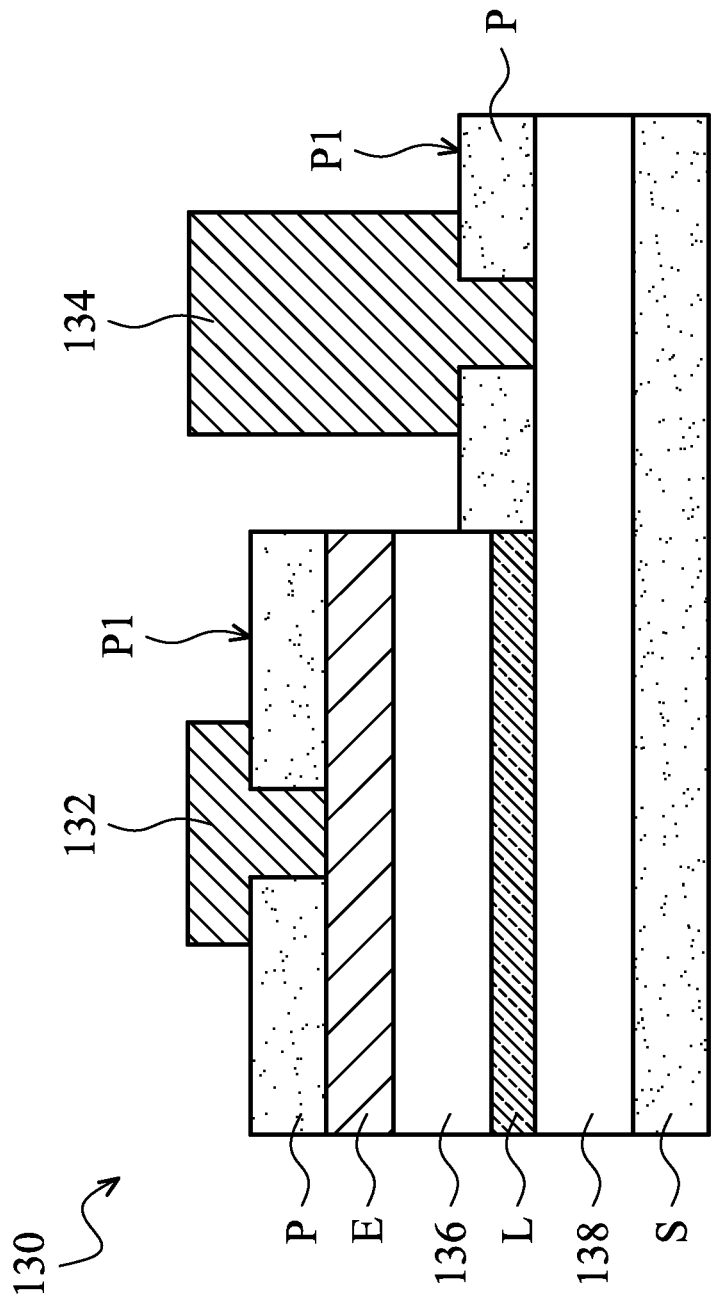
FIG. 3 is a cross-sectional view of the light emitting diode chip in FIG. 1.

FIG. 3 is a cross-sectional view of the light emitting diode chip in FIG. 1. Referring to FIG. 3, specifically, the light emitting diode chip 130 of the present embodiment includes a first-type semiconductor layer 136, a second-type semiconductor layer 138, a light emitting layer L, the first electrode 132, and the second electrode 134. In one embodiment, the light emitting diode chip 130 may optionally further include a transparent protective layer P.

The light emitting layer L is sandwiched between the first-type semiconductor layer 136 and the second-type semiconductor layer 138, and the transparent protective layer P covers the first-type semiconductor layer 136 and the second-type semiconductor layer 138. The first electrode 132 is disposed on the transparent protective layer P and penetrates through the transparent protective layer P to connect to the first-type semiconductor layer 136. The second electrode 134 is disposed on the transparent protective layer P and penetrates through the transparent protective layer P to connect to the second-type semiconductor layer 138.

The transparent protective layer P may include a transparent insulating material, and can protect the first-type semiconductor layer 136 and the second-type semiconductor layer 138 under the transparent protective layer P from environmental pollution or damage during subsequent processes, which improves the reliability and the life time of the light emitting diode chip 130. Furthermore, a surface P1 of the transparent protective layer P facing away from the first-type semiconductor layer 136 and the second-type semiconductor layer 138 may be a rough surface formed by a roughening treatment so as to facilitate the light emitted from the light emitting layer L to be extracted from the transparent protective layer P, which improves the overall light-emitting efficiency of the light emitting diode chip 130.

In one embodiment, the light emitting diode chip 130 may optionally further include a transparent electrode E. The transparent electrode E may be disposed on the first-type semiconductor layer 136, and the first electrode 132 may be disposed on the transparent electrode E to electrically connect to the transparent electrode E. The transparent electrode E can cover a large area of the first-type semiconductor layer 136 to uniformly disperse the electric current supplied to the first electrode 132 to the first-type semiconductor layer 136 and uniformly pass through the light emitting layer L, which improves the light-emitting efficiency of the light emitting diode chip 130. The transparent electrode E includes, for example, ITO or IZO.

In one embodiment, the light emitting diode chip 130 may optionally further include a transparent insulating substrate S, and the second-type semiconductor layer 138, the light emitting layer L, and the first-type semiconductor layer 136 are sequentially formed on the transparent insulating substrate S. The transparent insulating substrate S includes, for example, sapphire.

Figure 4:
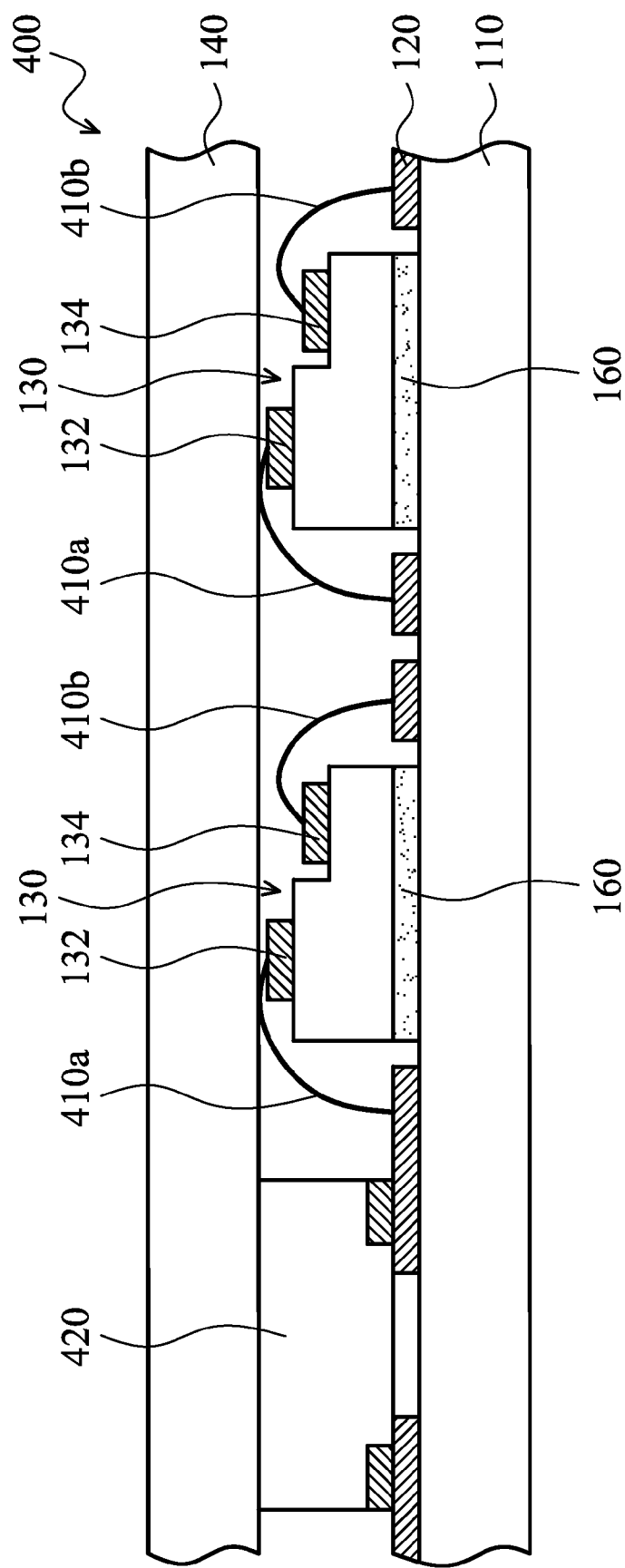
FIG. 4 is a cross-sectional view of a light emitting device in accordance with an embodiment of the present invention.

FIG. 4 is a cross-sectional view of a light emitting device in accordance with an embodiment of the present invention. Referring to FIG. 4, the light emitting device 400 of the present embodiment is similar to the light emitting device in FIG. 1 and FIG. 2 except that the light emitting diode chips 130 of the light emitting device 400 are electrically connected to the wiring layer 120 by wire bonding.

Specifically, the light emitting device 400 further includes a plurality of solder wires 410a and 410b, the first electrode 132 and the second electrode 134 of each of the light emitting diode chips 130 are connected to the wiring layer 120 through the solder wires 410a and 410b respectively. In the present embodiment, an adhesive layer 160 may be optionally formed between the light emitting diode chips 130 and the transparent substrate 110, and the adhesive layer 160 may be doped with a fluorescent material (not shown).

In one embodiment, a control chip 420 may be optionally disposed on the transparent substrate 110, wherein the control chip 420 may be electrically connected to the wiring layer 120 and output a control signal to the light emitting diode chips 130 through the wiring layer 120 to control the light emitting diode chips 130.

Figure 5:
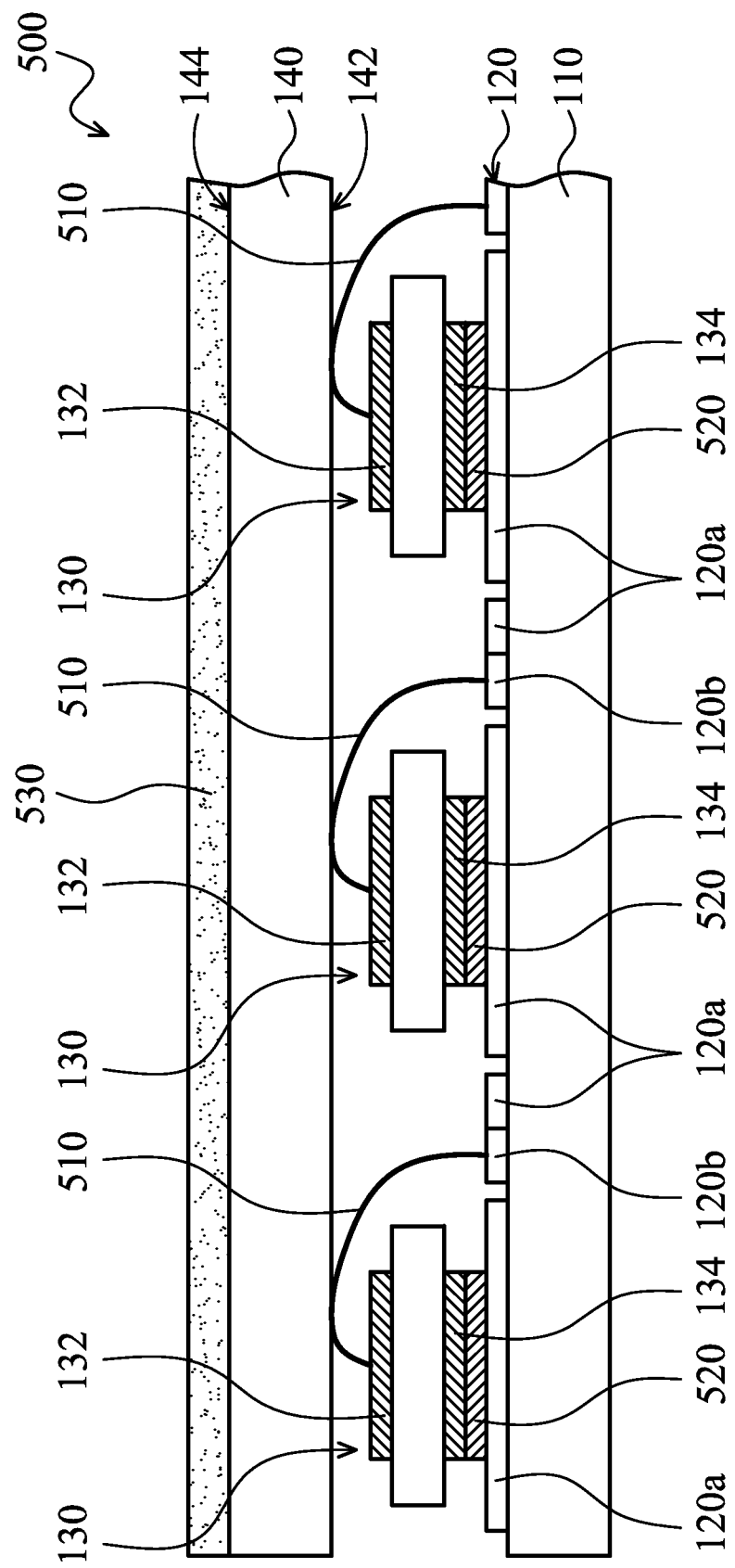
FIG. 5 is a cross-sectional view of a light emitting device in accordance with an embodiment of the present invention.

FIG. 5 is a cross-sectional view of a light emitting device in accordance with an embodiment of the present invention. Referring to FIG. 5, the light emitting device 500 of the present embodiment is similar to the light emitting device in FIG. 1 and FIG. 2 except that the light emitting diode chips 130 of the light emitting device 500 are vertical light emitting diode chips.

In this embodiment, the first electrode 132 of each of the light emitting diode chips 130 is connected to the wiring layer 120 through a solder wire 510, and a conductive paste 520 (such as silver paste) may be optionally disposed between the second electrode 134 and the wiring layer 120 to serve as an adhesive layer to electrically connect the second electrode 134 to the wiring layer 120.

In one embodiment, the wiring layer 120 may be a composite wiring layer including a transparent conductive portion 120a and a metal conductive portion 120b connected to the transparent conductive portion 120a. The transparent conductive portion 120a may include transparent conductive materials (such as ITO or IZO). The metal conductive portion 120b may include metals. The second electrode 134 may be electrically connected to the transparent conductive portion 120a through the conductive paste 520, and the first electrode 132 may be electrically connected to the metal conductive portion 120b through the solder wire 510.

In one embodiment, an adhesive layer 530 may be optionally disposed on the second surface 144 of the opposite substrate 140 or on the surface of the transparent substrate 110 to facilitate the attachment of the light emitting device 500 to surfaces of other objects (not shown), such as windows, walls, or ceilings.

In view of the foregoing, in the present invention, a plurality of light emitting diode chips are sandwiched between a transparent substrate and an opposite substrate, such that the light emitted by the light emitting diode chips can pass through the transparent substrate for illumination or advertising purposes. Furthermore, a transparent substrate may be used as the opposite substrate of the light emitting device, such that the light emitting device may substantially be a transparent board (or a transparent film), which can serve as a window, a decorative wall, or can be attached onto windows or decorative walls, and the light emitting diode chips may be lit up according to application needs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting device, comprising:
a transparent substrate;
a wiring layer on a top surface of the transparent substrate;
a plurality of light emitting diode chips on the transparent substrate and electrically connected to the wiring layer; and
an opposite substrate on the transparent substrate, wherein the light emitting diode chips and the wiring layer are sandwiched between the transparent substrate and the opposite substrate, and a first surface of the opposite substrate facing the light emitting diode chips is free from any wiring layer;
wherein the opposite substrate is another transparent substrate, such that the light emitted from the light emitting diode chips is observable from two opposite sides of the light emitting device.

2. The light emitting device as claimed in claim 1, wherein the wiring layer includes metal or transparent conductive materials.

3. The light emitting device as claimed in claim 1, wherein each of the light emitting diode chips has a first electrode and a second electrode, and each of the light emitting diode chips is flip-chip bonded to the wiring layer, such that the first electrode and the second electrode are electrically connected to the wiring layer.

4. The light emitting device as claimed in claim 1, wherein each of the light emitting diode chips has a first electrode and a second electrode having exposed top surfaces facing toward the opposite substrate, and the light emitting device further comprises:
a plurality of solder wires, wherein the first electrode and the second electrode are connected to the wiring layer through the solder wires respectively.

5. The light emitting device as claimed in claim 1, wherein each of the light emitting diode chips has a first electrode and a second electrode, and the first electrode is connected to the wiring layer through a solder wire, and the second electrode is disposed on the wiring layer, such that the first electrode and the second electrode are electrically connected to the wiring layer respectively.

6. The light emitting device as claimed in claim 1, further comprising:
an adhesive layer between the light emitting diode chips and the transparent substrate to affix the light emitting diode chips on the transparent substrate.

7. The light emitting device as claimed in claim 6, wherein the adhesive layer includes a transparent insulating paste.

8. The light emitting device as claimed in claim 7, further comprising:
a fluorescent powder doped in the transparent insulating paste.

9. The light emitting device as claimed in claim 6, wherein the adhesive layer includes a conductive paste.

10. The light emitting device as claimed in claim 1, wherein each of the light emitting diode chips comprises:
a first-type semiconductor layer;
a second-type semiconductor layer;
a light emitting layer sandwiched between the first-type semiconductor layer and the second-type semiconductor layer;
a transparent protective layer covering the first-type semiconductor layer and the second-type semiconductor layer;
a first electrode on the transparent protective layer and passing through the transparent protective layer to connect to the first-type semiconductor layer; and
a second electrode on the transparent protective layer and passing through the transparent protective layer to connect to the second-type semiconductor layer.

11. The light emitting device as claimed in claim 1, further comprising:
an adhesive layer on a surface of the transparent substrate or the opposite substrate.

12. The light emitting device as claimed in claim 1, wherein the transparent substrate is a flexible board.

13. The light emitting device as claimed in claim 1, wherein the transparent substrate and the opposite substrate are both rigid boards.

14. The light emitting device as claimed in claim 1, further comprising:

a control chip on the transparent substrate and electrically connected to the wiring layer.

15. The light emitting device as claimed in claim 1, wherein the light emitting diode chips and the wiring layer are located in a chamber sandwiched by the transparent substrate and the opposite substrate, and the light emitting device further comprises:

a filler material filling the chamber, wherein the filler material includes nitrogen, inert gases, or transparent paste.

16. The light emitting device as claimed in claim 15, wherein the transparent paste is doped with a fluorescent powder.

17. The light emitting device as claimed in claim 1, wherein the light emitting diode chips and the wiring layer are located in a chamber sandwiched by the transparent substrate and the opposite substrate, and the chamber is under vacuum.

\* \* \* \* \*